United States Patent [19]

Fukuzawa et al.

[11] 4,430,741
[45] Feb. 7, 1984

[54] SEMICONDUCTOR LASER DEVICE

[75] Inventors: Tadashi Fukuzawa, Tokyo; Michiharu Nakamura; Susumu Takahashi, both of Hinodemachi, all of Japan

[73] Assignee: Hitachi, Ltd., Tokyo, Japan

[21] Appl. No.: 225,399

[22] Filed: Jan. 15, 1981

[30] Foreign Application Priority Data

Jan. 23, 1980 [JP] Japan .................................. 55-5755

[51] Int. Cl.³ .............................................. H01S 3/19
[52] U.S. Cl. ....................................... 372/46; 357/17; 357/41; 372/50
[58] Field of Search ..................... 372/45, 46; 357/17, 357/41; 372/50

[56] References Cited

U.S. PATENT DOCUMENTS 4,217,561  8/1980  Scifres et al. ........................ 372/46

Primary Examiner—James W. Davie
Attorney, Agent, or Firm—Kenyon & Kenyon

[57] ABSTRACT

Disclosed is a semiconductor laser device comprising a semiconductor assembly which serves to effect laser oscillation and in which first, second and third semiconductor layers are successively stacked on a predetermined semiconductor body, at least the first and third semiconductor layers being small in the refractive index relative to the second semiconductor layer and great in the forbidden band gap relative thereto and having conductivity types opposite to each other, and means to spread depletion regions within at least a part of a current path for effecting the laser oscillation and in a manner to intersect with the current path. A small-sized semiconductor laser device capable of fast modulation can be realized.

5 Claims, 8 Drawing Figures

SEMICONDUCTOR LASER DEVICE

BACKGROUND OF THE INVENTION

1. Field of the Invention

This invention relates to a semiconductor laser device.

2. Description of the Prior Art

This invention provides a novel structure which permits the direct modulation of a semiconductor laser device. Also, this invention provides a novel structure which permits the mode control of a semiconductor laser device.

Since semiconductor laser devices are small in size and high in efficiency and are capable of fast modulation, the optical communication and other various applications such as data buses and computer links are considered.

In order to modulate the semiconductor laser device, current pulses of 30–200 mA are usually impressed on the device. However, when the modulation signal becomes a high speed on the order of 1–2 Gbits/sec, it is difficult to produce such great current pulses and directly modulate the laser device by means of a conventional silicon transistor.

In recent years, therefore, attempts to employ a GaAs-based material capable of faster modulation and to integrate a laser device and a field-effect transistor (hereinbelow, abbreviated to "FET") have been made. An example is described in a paper by I. Ury et al. contained in Appl. Phys. Lett. 34(7), April 1, 1979, pp. 430–431. Such examples, however, merely integrate the semiconductor laser and the FET on a single substrate.

SUMMARY OF THE INVENTION

This invention contemplates to provide a semiconductor laser device which is more useful than such prior arts as a light source for fast modulation.

The fundamental idea of this invention consists in incorporating the operating principle of a field-effect transistor into the current control of a laser device. In this case, the laser device and the FET are constructed so that a current flowing through the former may become a current of the latter through which the current flows substantially in the vertical direction.

FIG. 1 is a sectional view of a device showing a typical example of this invention. The figure illustrates a section perpendicular to the traveling direction of a laser beam.

Numeral 1 designates a p-type GaAs substrate, numeral 2 a first cladding layer which is a p-type $Ga_{0.7}Al_{0.3}As$ layer, numeral 3 an n-type GaAs layer which serves as an active layer of a laser device, numeral 4 a second cladding layer which is an n-type $Ga_{0.7}Al_{0.3}As$ layer, and numeral 7 an n-type GaAs layer. The respective semiconductor layers are successively formed on the GaAs substrate 1. Subsequently, the mesa-etching of selected parts is performed to form a stripe-shaped stacked semiconductor region. Subsequently, a GaAs layer of high resistivity 5 is grown on both the sides of the stacked semiconductor region. This structure is the so-called BH type structure (Buried Hetero Structure). Needless to say, the relations of the cladding layers and the active layer which constitute the semiconductor laser device portion are made the same as in conventional semiconductor lasers. That is, the cladding layer is great in the forbidden band gap and small in the refractive index relative to the active layer. In addition, the first and second cladding layers have conductivity types opposite to each other. Further, the semiconductor laser device of this example is formed with island regions 6 of the p-conductivity type for causing depletion regions in the semiconductor layers. The formation of the island regions may satisfactorily be resorted to such an expedient as selective diffusion and ion implantation. Electrodes 8 and 9 are disposed through an insulating layer 10 as lead-out electrodes. On the other hand, an electrode 11 is formed on the rear surface of the GaAs substrate 1. Naturally, surfaces perpendicular to the stripe direction are Fabry-Perot reflective surfaces.

The external lead-out electrodes are interconnected so that the electrode 9 may serve as a source electrode of an FET and that the electrode 11 may serve as a drain electrode. The electrodes 8 serve as gate electrodes of the FET. As illustrated in FIG. 2, when voltages are applied to the respective electrodes, depletion regions 12 are formed by a gate bias, and the region of a current to flow through the active layer 3 of the laser device is limited to a part 13.

In case where the laser beam needs to be modulated, a modulation signal is superposed on the gate bias, whereby the laser oscillation can be modulated.

The stripe width in the active layer of the semiconductor laser device is greatly influential on the oscillation mode of the laser. According to the semiconductor laser device of this invention, the oscillation mode of the laser can be controlled by controlling the gate bias.

The semiconductor laser of this invention includes the type in which the depletion region extends to the active layer, and the type in which the depletion region does not extend to the active layer. Examples of the former are Embodiments 1–3 to be described later, and Embodiments 4–6 belong to the latter.

The semiconductor laser of this invention has the following advantages:

(1) Since the laser device and the modulating FET are formed in a manner to be stacked in the vertical direction, the semiconductor laser can be made very small in size.

(2) The semiconductor laser can be manufactured by the use of the ordinary liquid epitaxial growth, and the manufacturing process is easy.

(3) A laser device needs, in general, a current of several tens to 100 mA, and an FET to be combined therewith is required to be great in the allowable current and the mutal conductance ($g_m$). Since the vertical FET employed in this invention can freely control the interval of the two gate electrodes, an FET having desired specifications can be realized without hindrance. Accordingly, the FET being great in the current and $g_m$ is easily obtained, and also the chip size can be made small.

(4) Unlike the mere integration, the integration in the vertical type is adopted. Therefore, interconnections between the semiconductor laser device and the FET are substantially unnecessary, and parasitic capacitances can be reduced.

Further, the type in which the depletion region reaches the active layer has the following features:

(1) Not only the mere direct modulation, but also the control of a lateral mode is possible because the depletion regions substantially limit the current path.

(2) The integration of the semiconductor laser device and the FET in the prior art has been made without interconnecting the respective devices externally. Accordingly, the parasitic capacitances and inductances of interconnections have become lower than in case of assembling the separate devices, but the limit of high-frequency modulation characteristics has been determined by the current modulation limit of the laser device. This is approximately 1 GHz–2 GHz.

In contrast, in this invention, the gain of the laser is varied by means of the depletion regions themselves, and hence, a faster modulation than in the prior-art current modulation system is possible. In the case where the depletion regions extend to the active layer in which the recombination between electrons and holes develops, the number of electrons within the active layer is forcibly changed by the depletion regions, to change the power of the laser device. This change is much faster than in the system in which the current to be externally supplied is modulated.

Further, even in the case where the depletion regions are short of the active layer, an electrooptic effect in the active layer as based on the appearance of the depletion regions in the vicinity of the active layer changes the refractive index of this semiconductor layer. Embodiment 4 is such an example. The change of the refractive index results in a change in the effect of optical confinement within the active layer, and the power of the laser device can be modulated. This modulation system exploiting the loss of the gain can make the modulation of the laser device faster than the prior-art modulation based on the supplied current.

PREFERRED EMBODIMENTS OF THE INVENTION

Figure 1:
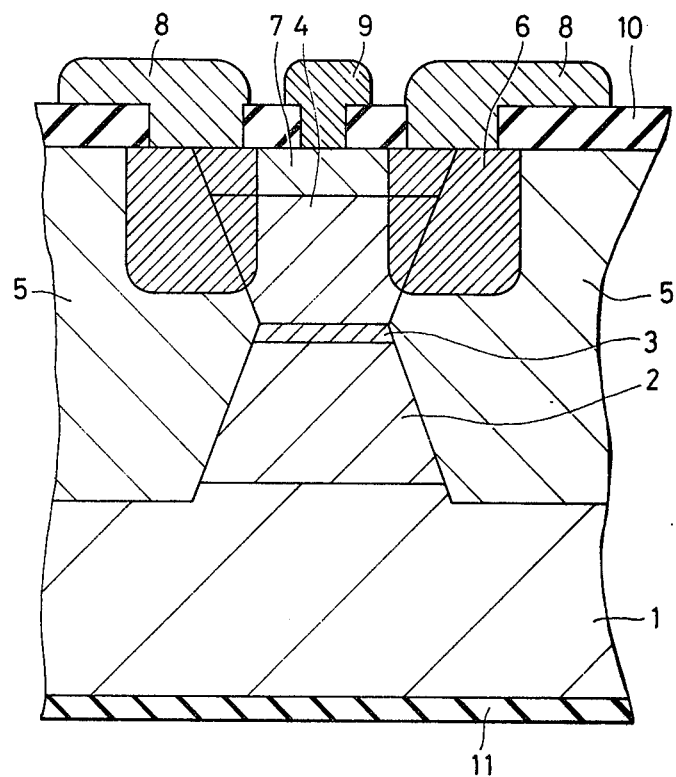
FIGS. 1, 3, 4 and 5 are sectional views each showing a semiconductor laser device of this invention.
Figure 2:
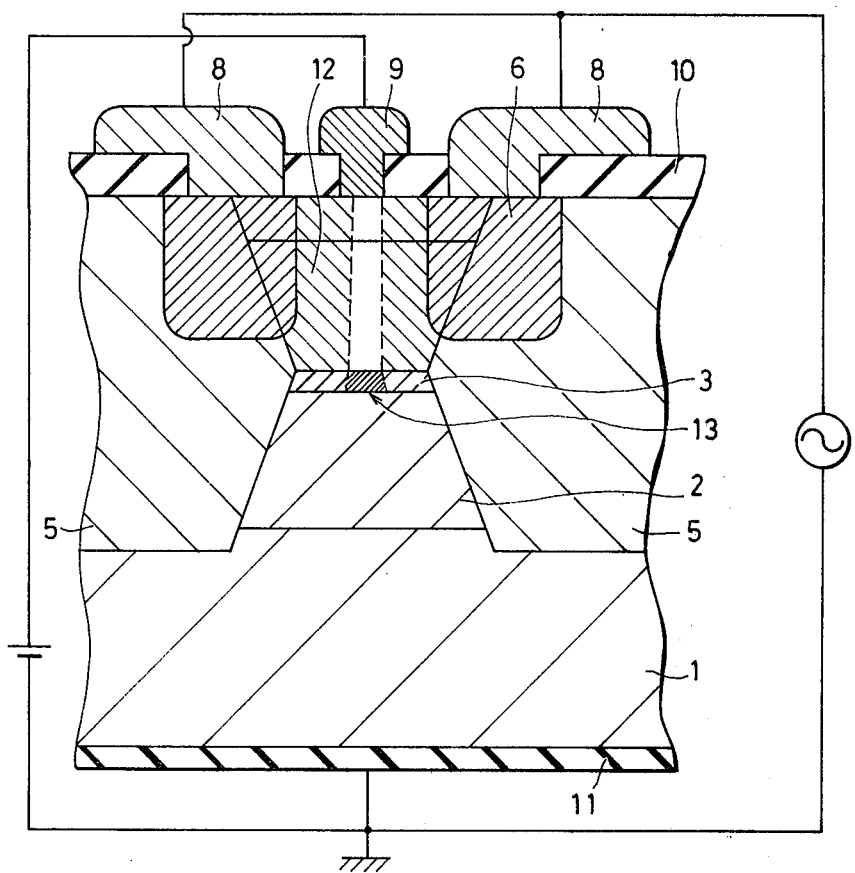
FIG. 2 is a sectional view for explaining the operation of the semiconductor laser device in FIG. 1, and FIGS. 6 to 8 are sectional views of a device showing the respective steps of a manufacturing process in another example of this invention.

Embodiment 1:

Description will be made with reference to FIG. 1.

On a p-type GaAs substrate (hole density $p \approx 10^{18}/cm^3$) 1 which had the (100) face as its upper surface, there were grown the respective layers of a p-$Ga_{0.65}Al_{0.35}As$ layer ($p \sim 10^{18}/cm^3$, 1.6 $\mu m$ thick) 2, an undoped $Ga_{0.95}Al_{0.05}As$ layer (0.1 $\mu m$ thick) 3, an n-$Ga_{0.65}Al_{0.35}As$ layer ($n \sim 5 \times 10^{18}/cm^3$, 2 $\mu m$ thick) 4 and an n-GaAs layer (0.2 $\mu m$ thick) 7.

On the surface of the semiconductor layer 7, an $SiO_2$ film having a thickness of 5,000 Å was formed by the CVD (Chemical Vapor Deposition) process. The $SiO_2$ film was etched into the shape of stripes being 5 $\mu m$ wide with the well-known photolithographic technique. Using the resultant $SiO_2$ film as a mask, the semiconductor layers 2, 3, 4 and 7 were etched with an etchant which was a mixed solution consisting of phosphoric acid, hydrogen peroxide and water.

A $Ga_{0.7}Al_{0.3}As$ layer was grown as a burying semiconductor layer 5 by relying on the liquid epitaxial growth again. This layer was made a high resistivity (1 $k\Omega \cdot cm$).

Subsequently, an insulating film made up of two layers of $Al_2O_3$ being 0.2 $\mu m$ thick and $SiO_2$ being 0.3 $\mu m$ thick was formed by the well-known CVD process. Those two parts of the double-layered insulating film which corresponded to gate electrode leading-out portions of the semiconductor laser device of this invention were provided with openings at an interval of 2 $\mu m$. Etchants were a mixed solution consisting of hydrogen fluoride and ammonium fluoride (at 1:6 for $SiO_2$) and phosphoric acid (for $Al_2O_3$). The resultant double-layered $SiO_2$-$Al_2O_3$ film served as a mask for selective diffusion. Zn was diffused through the openings so as to reach the second cladding layer 4, by the use of the well-known selective diffusion process. Shown at 6 are the Zn diffused regions.

The double-layered insulating film serving as the mask for the selective diffusion was removed, and an $SiO_2$ film 10 having a thickness of 5,000 Å was formed by the CVD process anew. Using the conventional photolithography, the $SiO_2$ film 10 was provided with openings for leading out electrodes. As a source lead-out electrode, an Au-Ge alloy, Ni and Au were evaporated as three layers to a thickness of 0.8 $\mu m$. Cr-Au was evaporated for gate electrodes. Subsequently, the rear surface of the semiconductor substrate 1 was polished and lightly etched, whereupon a Cr-Au alloy was evaporated as a p-side electrode 11.

Lastly, crystal planes were cloven along planes normal to the traveling direction of a laser beam, to construct an optical resonator. The cavity length was made 300 $\mu m$. The semiconductor laser device was oscillated under conditions of an oscillation wavelength of 8,370 Å and a threshold current of 30 mA. With a D.C. voltage of −1.5 V applied to the gates of the FET, the laser device could be modulated by applying a high-frequency input of 0.5 V. The high-frequency modulation was possible up to about 5 GHz.

Although the impurity island regions 6 functioning as the gates were formed by the diffusion process in the above example, another method, for example, the ion implantation process may well be resorted to.

Embodiment 2:

It is needless to say that the present invention is not restricted to the GaAs-GaAlAs-based material, but that it can be realized with other semiconductor materials.

By way of example, the semiconductor light-emitting device of this invention can be realized by a construction to be stated below.

Since the basic process is the same as in the foregoing example, the principal constituents will be briefly described with reference to FIG. 1.

As a semiconductor substrate, an InP substrate (Sn-doped, $3 \times 10^{18}/cm^3$) 1 having the (100) plane as its upper surface was used. On the substrate 1, there were formed by the liquid epitaxial growth an n-type InP layer (Te-doped, $n \approx 3 \times 10^{18}/cm^3$) as a first cladding layer 2 to a thickness of 3 $\mu m$, a p-type $In_{0.73}Ga_{0.27}As_{0.59}P_{0.41}$ layer (Zn-doped, $p \approx 1 \times 10^{18}/cm^3$) as an active layer 3 to a thickness of 0.2 $\mu m$, a p-type InP layer (Zn-doped, $p \approx 2 \times 10^{18}/cm^3$) as a second cladding layer 4 to a thickness of 2 $\mu m$, and further a p-type $In_{0.73}Ga_{0.27}As_{0.59}P_{0.41}$ layer to a thickness of 0.2 $\mu m$. Since the last-mentioned layer is necessary for the crystal growth and is not always necessary for the device structure, it may well be omitted in the process.

For the gate operation of an FET, an impurity such as Si and Sn was diffused to form n-type island regions 6.

It was the same as in Embodiment 1 that a drain electrode 9 of the FET and gate electrodes 8 thereof were respectively formed of Cr-Au and Au-Ge-Ni through an insulating layer 10. On the rear surface of the semiconductor substrate 1, Au-Ge-Ni was evaporated as a source electrode. Lastly, crystal planes were cloven along planes normal to the traveling direction of a laser beam, to construct an optical resonator.

When the laser device was oscillated at an oscillation wavelength of 1.3 μm and a threshold current of 50 mA, the modulation was possible up to about 5.3 GHz.

Figure 3:
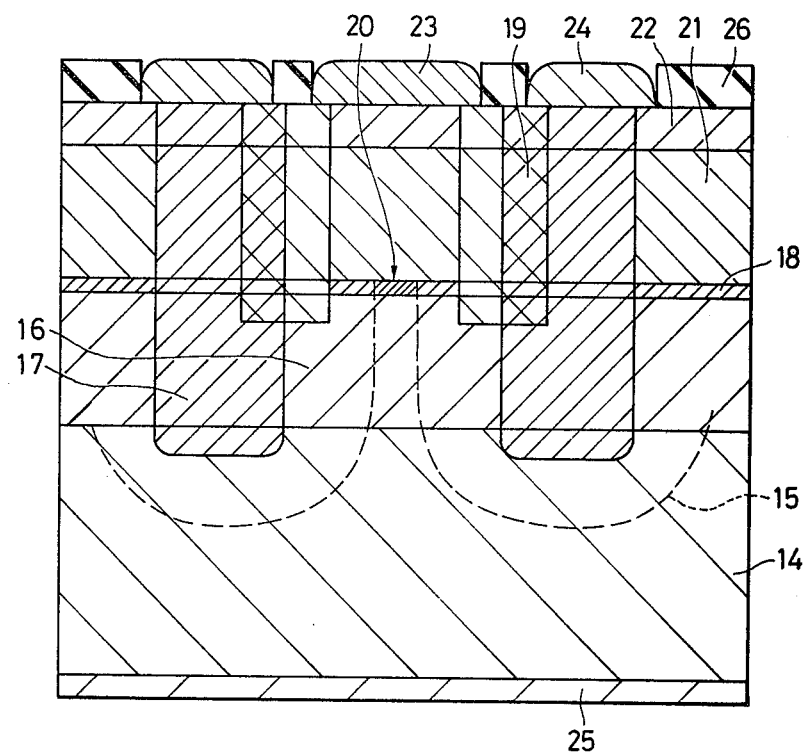

Embodiment 3:

This embodiment gives a modification of the island regions functioning as the gates of the FET. It will be described with reference to FIG. 3.

On an n-type GaAs substrate (electron density $n \approx 10^{18}/cm^3$) 14 having the (100) face as its upper surface, the following layers were formed by the well-known liquid epitaxial growth.

As a semiconductor layer 16 serving as a first cladding layer, an n-type $Ga_{0.7}Al_{0.3}As$ layer ($n \approx 5 \times 10^{17}/cm^3$) was formed to a thickness of 2 μm; as a semiconductor layer 18 serving as an active layer, an n-type GaAs layer ($n \approx 10^{16}/cm^3$) was formed to a thickness of 0.1 μm; as a semiconductor layer 21 serving as a second cladding layer, a p-type $Ga_{0.7}Al_{0.3}As$ layer (hole density $p \approx 5 \times 10^{17}/cm^3$) was formed to a thickness of 1 μm; and as a semiconductor layer 22, a p-type GaAs layer ($p \approx 1 \times 10^{18}/cm^3$) was formed to a thickness of 0.3 μm.

Subsequently, an insulating film made up of two layers of $Al_2O_3$ being 0.2 μm thick and $SiO_2$ being 0.3 μm thick was formed by the well-known CVD (Chemical Vapor Deposition) process. Those parts of the double-layered insulating film which corresponded to island regions 17 to construct gate portions of an FET were provided with openings, and the resultant insulating film was used as a mask for selective diffusion. Etchants were a mixed solution consisting of hydrogen fluoride and ammonium fluoride (at 1:6 for $SiO_2$) and phosphoric acid (for $Al_2O_3$). Zn was diffused through the openings by the well-known selective diffusion process so that the depth might reach the semiconductor layer 14. Thereafter, island regions of high resistivity 19 were formed by the implantation of protons so as to cut off a lateral current path in the semiconductor layer 21. A drain electrode 23 and gate electrodes 24 were simultaneously formed by evaporating Cr-Au, and Au-Ge-Ni was evaporated as a source electrode 25. Shown at 26 is an insulating layer. It was as previously stated that an optical resonator was constructed by cleaving crystal faces along planes normal to the traveling direction of a laser beam. In operation, depletion regions 15 were created, so that current was confined.

Figure 4:
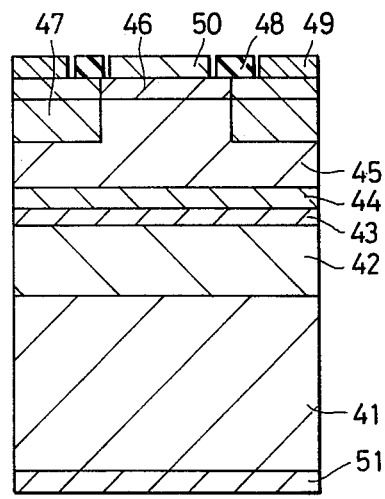

Embodiment 4:

This embodiment gives a gain-guide type laser exploiting the fact that the region through which current flows becomes a narrow strip owing to the current constriction by the gates (an index difference for confining the laser beam need not be especially set in the lateral direction). It will be described with reference to FIG. 4.

On a p+-GaAs substrate 41, the following semiconductor layers were grown by the well-known liquid epitaxial growth.

As a semiconductor layer 42 to serve as a first cladding layer, a p+-$Ga_{0.7}Al_{0.3}As$ layer was provided 1 μm to 2 μm; as an active layer 43, an undoped GaAs layer was provided 0.05 μm to 0.2 μm; and an n+-$Ga_{0.7}Al_{0.3}As$ layer 44 was provided 0.1 μm to 0.2 μm. The layer 44 is not always necessary, but it is effective to prevent the lowering of an optical output attendant upon a temperature rise. To this end, the layer 44 needs to be higher in concentration than a layer 45, and the concentration thereof was made $2 \times 10^{17}/cm^3$ in this example. The n-$Ga_{0.7}Al_{0.3}As$ layer 45 was formed 1 μm to 2 μm, and an n-GaAs layer was lastly formed as a cap layer 46. Using the methods and materials stated in Embodiment 1, there were formed P-channels 47 and a source electrode 50, a drain electrode 51 and gate electrodes 49. Shown at 48 is an insulating layer.

The laser device could oscillate under conditions of an oscillation wavelength of 8,300 Å and a threshold current of 100 mA. About ten vertical modes were observed. The modulation was possible up to approximately 2.5 GHz.

It goes without saying that a semiconductor laser may well be constructed by bringing the aforecited respective semiconductor layers into the opposite conductivity types.

Embodiment 5:

Regions to effect the FET operation for the current control may well be formed in a semiconductor layer outside the optical confinement region of the semiconductor laser. This embodiment is one of such examples. Also in this case, the semiconductor laser can be directly modulated.

Figure 5:
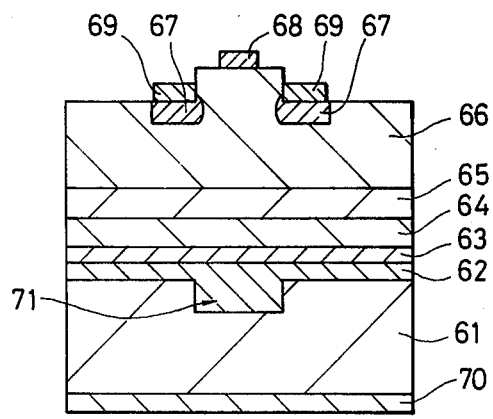

The embodiment will be described with reference to FIG. 5. The figure is a sectional view taken along a plane parallel to mirror faces constituting the Fabry-Pérot resonator of a semiconductor laser device.

On an n-type GaAs substrate (electron density $n \approx 10^{18}/cm^3$) 61 having the (100) face as its upper surface, a stripe-shaped recess 71 was formed. Subsequently, respective layers to be stated below were formed by the well-known liquid epitaxial growth. The recess may be formed by the selective etching process or the like in a manner to extend perpendicularly to the reflective faces of the resonator. A semiconductor layer with a flat surface can be readily formed on a semiconductor substrate having an unevenness of several μm or so, by the liquid epitaxial growth.

The recess serves to execute the control of lateral modes by exploiting the leakage of a laser beam to the substrate. This technique of optical confinement has been reported in detail in K. Aiki et al.; IEEE J. Quantum Electron QE-14, 89 (1978), etc.

As a first semiconductor layer 62, an n-type $Ga_{0.7}Al_{0.3}As$ layer was made 2 μm thick; as a second semiconductor layer 63 to serve as an active layer, an n-type GaAs layer ($n \approx 10^{16}/cm^3$) was made 0.1 μm thick; as a third semiconductor layer 64, a p-type $Ga_{0.7}Al_{0.3}As$ layer (hole density $p \approx 5 \times 10^{17}/cm^3$) was made 1 μm thick; as a fourth semiconductor layer 65, a p+-GaAs (or p-GaAs) layer was made 0.5 μm — 1 μm thick; and as a fifth semiconductor layer 66, a p-type GaAs layer ($p \approx 5 \times 10^{16}/cm^3$) was made 1 μm to 2 μm thick. The layer 65 serves to facilitate the crystal growth of semiconductor layers above it. It can also be omitted.

Subsequently, n+ impurity regions 67 were formed by the ion implantation process. They were made approximately 0.3 μm to 0.7 μm thick. Thereafter, the layer 66 was etched with the n+ impurity regions 67 left behind to the extent of 0.4 μm. In a part to become a drain electrode 68, an ohmic electrode was made of a Cr-Au-based metal by the lift-off method employing a photoresist film. Au-Ge-Ni metal films were formed as gate electrodes 69, and an Au-Ge-Ni metal film was evaporated on the rear surface of the semiconductor substrate 61 as a source electrode 70.

The laser device had a threshold current of 30 mA, and the modulation was possible up to 3 GHz.

The semiconductor laser device of the present structure has the following features:

(1) The laser device and the modulating FET are formed in the vertical direction, and the laser can be made very small in size.

(2) The laser device needs several tens — 100 mA, and requires the FET of great current and mutual conductance ($g_m$). The vertical FET as in this invention has a structure meeting this purpose. Accordingly, the current and $g_m$ can be set at great values, and the chip size can be made small.

Embodiment 6:

This embodiment is an example in which the regions to effect the FET operation for the current control are disposed in the semiconductor substrate. It permits the direct modulation of the semiconductor laser device.

Figure 6:
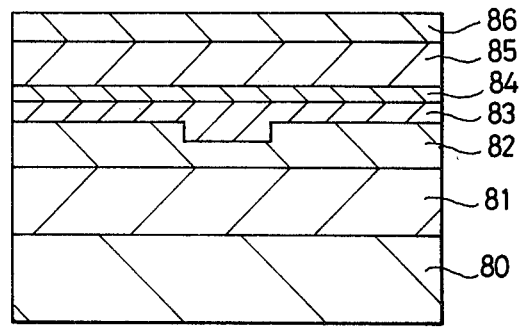
Figure 7:
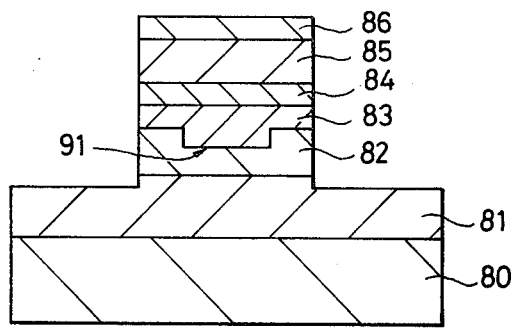
Figure 8:
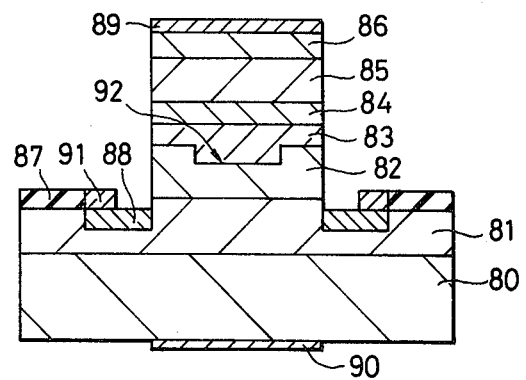

FIGS. 6 to 8 are sectional views of a device showing the respective manufacturing steps of a manufacturing process for the semiconductor light-emitting device of this invention. The figures are sections taken along a plane parallel to mirror faces constituting the Fabry-Pérot resonator of the semiconductor laser device.

On an $n^+$-type GaAs substrate (electron density $\approx 10^{18}/cm^3$) 80 having the (100) face as its upper surface, respective layers to be stated below were formed by the well-known liquid epitaxial growth employing a slide boat. An n-type GaAs layer 81 (electron density $\approx 5 \times 10^{16}/cm^3$) was formed 1 μm to 2 μm, and an $n^+$-type GaAs layer 82 ($n \approx 5 \times 10^{17}/cm^3$) was formed 0.5 μm to 1 μm. A stripe-shaped recess 91 was formed in a desired part of the semiconductor layer 82. It plays the same role as the recess in Embodiment 5, and is not always necessary. On the semiconductor layer 82, the following semiconductor layers were successively grown anew.

As a semiconductor layer 82 forming a first cladding layer, an n-type Ga$_{0.7}$Al$_{0.3}$As layer ($n \approx 5 \times 10^{17}/cm^3$) was made 2 μm thick; as a semiconductor layer 84 forming an active layer of the laser device, an n-type GaAs layer ($n \approx 10^{16}/cm^3$) was made 0.1 μm thick; as a semiconductor layer 85 forming a second cladding layer, a p-type Ga$_{0.7}$Al$_{0.3}$As layer (hole density $p \approx 5 \times 10^{17}/cm^3$) was made 1 μm thick; and as a semiconductor layer 86, a p-type GaAs layer ($p \approx 2 \times 10^{17}/cm^3$) was made 0.3 μm thick.

On the semiconductor layer 86, an SiO$_2$ film which was 5,000 Å thick was formed by the CVD process. A photoresist film was formed on the SiO$_2$ film, and using the conventional photolithography, the SiO$_2$ film was etched to remain in the shape of a stripe in a predetermined position. Using the remaining SiO$_2$ films as an etching mask, the semiconductor layers 82, 83, 84, 85 and 86 were mesa-etched. An etchant was a mixed solution consisting of phosphoric acid, hydrogen peroxide and ethylene glycol (at 1:1:8).

FIG. 7 is a view showing this state.

At this time, it is favorable that the etching section defines an acute angle with respect to the semiconductor layer 81. Thereafter, an SiO$_2$ film was deposited on the whole surface of the semiconductor body approximately 30 nm by the well-known thermodecomposition process. Further, a positive type photoresist film was applied on the whole surface. Those regions of the photoresist film which corresponded to gate electrodes 91 were provided with openings. At this time, openings may well be simultaneously provided in correspondence with a drain electrode 89. Using the resultant photoresist film as a mask, ions were implanted. After removing the photoresist film, the semiconductor body was annealed. Numeral 87 in FIG. 7 indicates the remaining part of the SiO$_2$ film described before. Numeral 88 indicates the impurity regions formed by the ion implantation.

Likewise to the embodiments thus far described, the gate electrodes 91 and the drain electrode 89 were formed of Cr-Au metal films, and a source electrode 90 was formed of an Au-Ge-Ni metal film. FIG. 8 is the sectional view of the semiconductor laser device showing this state.

The gate length of the FET portion in the semiconductor laser device of the present embodiment is determined by the stacked portion of the semiconductor layers, and the device is excellent in controllability. Of course, an FET employing a Schottky junction can also be fabricated.

The semiconductor laser device of this embodiment has the following features:

(1) The oscillation mode of the laser device can be controlled, not only by the laser structure, but also by the FET operation.

(2) Since the gate electrode portion is formed by the self-alignment method through the semiconductor layer region to effect the laser oscillation, the precision of the positioning between the laser device and the gate electrodes is high. Accordingly, the path through which current flows is controlled well, and the controls of the modulation characteristics and the oscillation mode or the oscillation efficiency can be enhanced.

It is a matter of course that the semiconductor materials indicated in the embodiments of this invention are not restrictive. There are various means for the mode stabilization of semiconductor lasers, and they may of course be applied to the semiconductor laser portion of the light-emitting semiconductor device of this invention and are covered within the scope of this invention. Needless to say, operations are possible in cases of changing the p-channel in the present embodiment into the n-channel, or vice verse.

What is claimed is:

1. A semiconductor laser device comprising:
   a semiconductor assembly for effecting laser oscillation in which at least first, second and third semiconductor layers are successively stacked on a predetermined semiconductor body, said first and third semiconductor layers being small in a refractive index and great in a forbidden band gap relative to said second semiconductor layer and having conductivity types opposite to each other,
   current injection means for the laser oscillation and including a first electrode disposed on a crystal surface of said semiconductor assembly remote from said semiconductor body, and a second electrode disposed on a surface of said semiconductor body,
   means including spaced impurity regions and electrodes connected thereto for controlling depletion regions within a path of current of said current injection means in a manner such as to intersect with the current path, and an optical resonator for the laser oscillation.

2. A semiconductor device according to claim 1, wherein said impurity regions are formed at a predetermined interval in said semiconductor assembly.

3. A semiconductor laser device according to claim 2, wherein said predetermined interval is disposed above said second semiconductor layer.

4. A semiconductor laser device according to claim 2, wherein said predetermined interval is in a semiconductor layer below said second semiconductor layer.

5. A semiconductor laser device according to claim 1, wherein said impurity regions are formed at a predetermined interval in said semiconductor body.

* * * * *